United States Patent
Houle et al.

(10) Patent No.: US 9,142,480 B2
(45) Date of Patent: Sep. 22, 2015

(54) MICROELECTRONIC PACKAGE WITH HIGH TEMPERATURE THERMAL INTERFACE MATERIAL

(75) Inventors: Sabina Houle, Phoenix, AZ (US); Daewoong Suh, Phoenix, AZ (US); Charles Hill, Gilbert, AZ (US)

(73) Assignee: Intel Corporation, Santa Clara, CA (US)

(*) Notice: Subject to any disclaimer, the term of this patent is extended or adjusted under 35 U.S.C. 154(b) by 852 days.

(21) Appl. No.: 12/192,679

(22) Filed: Aug. 15, 2008

(65) Prior Publication Data

US 2010/0039777 A1  Feb. 18, 2010

(51) Int. Cl.
*H01L 23/42* (2006.01)
*H01L 23/24* (2006.01)
*H05K 7/20* (2006.01)

(52) U.S. Cl.
CPC ............. *H01L 23/42* (2013.01); *H01L 23/24* (2013.01); *H05K 7/20481* (2013.01); *H01L 2924/0002* (2013.01); *H01L 2924/1433* (2013.01)

(58) Field of Classification Search
CPC ........................................................ H01L 23/24
USPC .......... 257/712, 633, 747, 789, E21.499, 690, 257/E23, E21, 778; 438/122, 108, 118; 361/718
See application file for complete search history.

(56) References Cited

U.S. PATENT DOCUMENTS

| | | | | |
|---|---|---|---|---|
| 4,520,305 A * | 5/1985 | Cauchy | ........................ | 322/2 R |
| 5,169,805 A * | 12/1992 | Mok et al. | ..................... | 438/117 |
| 5,710,459 A * | 1/1998 | Teng et al. | ..................... | 257/717 |
| 5,907,189 A * | 5/1999 | Mertol | ......................... | 257/787 |
| 5,926,371 A * | 7/1999 | Dolbear | ....................... | 361/704 |
| 5,933,324 A * | 8/1999 | Barrett | ......................... | 361/703 |
| 6,008,536 A * | 12/1999 | Mertol | ......................... | 257/704 |
| 6,118,177 A * | 9/2000 | Lischner et al. | ............. | 257/706 |
| 6,188,578 B1 * | 2/2001 | Lin et al. | ...................... | 361/717 |
| 6,409,859 B1 * | 6/2002 | Chung | ........................... | 156/69 |
| 6,504,096 B2 * | 1/2003 | Okubora | ...................... | 174/521 |
| 6,518,666 B1 * | 2/2003 | Ikeda | ........................... | 257/738 |
| 6,519,154 B1 * | 2/2003 | Chiu | ............................ | 361/704 |
| 6,653,730 B2 * | 11/2003 | Chrysler et al. | ............. | 257/704 |
| 6,737,754 B2 * | 5/2004 | Ma et al. | ...................... | 257/796 |
| 6,744,132 B2 * | 6/2004 | Alcoe et al. | .................. | 257/706 |
| 6,987,671 B2 * | 1/2006 | Houle | .......................... | 361/704 |
| 7,032,392 B2 * | 4/2006 | Koeneman et al. | ............... | 62/77 |
| 7,183,641 B2 * | 2/2007 | Renavikar et al. | ........... | 257/713 |
| 7,332,823 B2 * | 2/2008 | Khaw et al. | .................... | 257/787 |
| 7,592,697 B2 * | 9/2009 | Arana et al. | ................... | 257/714 |
| 7,678,615 B2 * | 3/2010 | Touzelbaev et al. | .......... | 438/122 |
| 7,719,110 B2 * | 5/2010 | Zhao et al. | .................... | 257/707 |
| 7,915,081 B2 * | 3/2011 | Tomita et al. | ................. | 438/109 |
| 2002/0143092 A1 * | 10/2002 | Matayabas, Jr. | .............. | 524/439 |
| 2002/0175403 A1 * | 11/2002 | Sreeram et al. | ............... | 257/702 |

(Continued)

*Primary Examiner* — Yu-Hsi D Sun
*Assistant Examiner* — Ankush Singal
(74) *Attorney, Agent, or Firm* — Winkle, PLLC

(57) ABSTRACT

A microelectronic package is provided. The microelectronic package includes a substrate, a die coupled to a top surface of the substrate and a integrated heat spreader thermally coupled to the die, wherein the integrated heat spreader comprises integrated heat spreader walls. The microelectronic package also includes a thermal interface material disposed between the die and the integrated heat spreader and an underfill material disposed between the integrated heat spreader and the substrate, wherein the underfill material is disposed within gaps between the integrated heat spreader walls, the die and the thermal interface material.

2 Claims, 4 Drawing Sheets

(56) References Cited

U.S. PATENT DOCUMENTS

| | | | |
|---|---|---|---|
| 2004/0052050 A1* | 3/2004 | Koning et al. | 361/700 |
| 2004/0113185 A1* | 6/2004 | Shibayama et al. | 257/292 |
| 2004/0238947 A1* | 12/2004 | Rumer et al. | 257/707 |
| 2004/0262372 A1* | 12/2004 | Houle et al. | 228/246 |
| 2004/0262766 A1* | 12/2004 | Houle | 257/758 |
| 2005/0035113 A1* | 2/2005 | Shi et al. | 219/685 |
| 2005/0280142 A1* | 12/2005 | Hua et al. | 257/707 |
| 2006/0063310 A1* | 3/2006 | Jadhav et al. | 438/122 |
| 2006/0073344 A1* | 4/2006 | Jayaraman | 428/414 |
| 2006/0091562 A1* | 5/2006 | Lee | 257/778 |
| 2006/0141671 A1* | 6/2006 | Houle et al. | 438/122 |
| 2006/0260793 A1* | 11/2006 | Yang et al. | 165/185 |
| 2006/0261467 A1* | 11/2006 | Colgan et al. | 257/707 |
| 2007/0020813 A1* | 1/2007 | Fitzgerald et al. | 438/122 |
| 2007/0023488 A1* | 2/2007 | Lawlyes et al. | 228/180.22 |
| 2007/0035012 A1* | 2/2007 | Deppisch et al. | 257/706 |
| 2007/0108578 A1* | 5/2007 | Watanabe | 257/680 |
| 2007/0152325 A1* | 7/2007 | Dani et al. | 257/717 |
| 2007/0216009 A1* | 9/2007 | Ng | 257/690 |
| 2007/0231953 A1* | 10/2007 | Tomita et al. | 438/106 |
| 2008/0001282 A1* | 1/2008 | Modi et al. | 257/710 |
| 2008/0150170 A1* | 6/2008 | Manepalli et al. | 257/795 |
| 2008/0157300 A1* | 7/2008 | Chuang et al. | 257/675 |
| 2008/0157345 A1* | 7/2008 | Lu et al. | 257/712 |
| 2008/0157348 A1* | 7/2008 | Hu et al. | 257/713 |
| 2008/0185713 A1* | 8/2008 | Dani et al. | 257/713 |
| 2008/0237843 A1* | 10/2008 | Gupta et al. | 257/713 |
| 2008/0239660 A1* | 10/2008 | Mustapha et al. | 361/688 |
| 2009/0057881 A1* | 3/2009 | Arana et al. | 257/714 |
| 2009/0243085 A1* | 10/2009 | Houle | 257/712 |
| 2010/0127388 A1* | 5/2010 | Stanley et al. | 257/712 |
| 2011/0042784 A1* | 2/2011 | Edwards et al. | 257/532 |

\* cited by examiner

| Alloy | Cu | Ag | Alloying element (mol%) | | | | | Total % | Total target% for 210C |
|---|---|---|---|---|---|---|---|---|---|
| | | | Bi | Zn | In | Ti | Y | | |
| eutectic % | 1.3 | 3.8 | 43 | 14.9 | 51.7 | 0.5 | 1.6 | | 9.33 |
| Alloy 1 | 1.3 | 3.8 | 2 | 2 | 0.23 | | | 9.33 | |
| Alloy 2 | 1.3 | 3.8 | 4 | | 0.23 | | | 9.33 | |
| Alloy 4 | 1.3 | 3.8 | | 4 | 0.23 | | | 9.33 | |
| Alloy 5 | 1.3 | 3.8 | 2 | 0.23 | 2 | | | 9.33 | |
| Alloy 6 | 1.3 | 3.8 | 1 | 0.23 | 3 | | | 9.33 | |
| Alloy 7 | 1.3 | 3.8 | 3 | 0.23 | 1 | | | 9.33 | |
| Alloy 8 | 1.3 | 3.8 | 0.23 | 2 | 2 | | | 9.33 | |
| Alloy 9 | 1.3 | 3.8 | 0.23 | 1 | 3 | | | 9.33 | |
| Alloy 10 | 1.3 | 3.8 | 0.23 | 3 | 1 | | | 9.33 | |
| Alloy 11 | 1.3 | 3.8 | 1.86 | | 1.87 | 0.5 | | 9.33 | |
| Alloy 12 | 1.3 | 3.8 | 0.6 | | 3.13 | 0.5 | | 9.33 | |
| Alloy 13 | 1.3 | 3.8 | 3.23 | 0.5 | | 0.5 | | 9.33 | |
| Alloy 14 | 1.3 | 3.8 | | 0.5 | 3.23 | 0.5 | | 9.33 | |
| Alloy 15 | 1.3 | 3.8 | | | | | | 5.10 | |
| Alloy 16 | 1.3 | 3.8 | | | | | | 5.10 | |
| Alloy 17 | 1.3 | 3.8 | | | | | | 5.10 | |

FIG. 3

MICROELECTRONIC PACKAGE WITH HIGH TEMPERATURE THERMAL INTERFACE MATERIAL

BACKGROUND

With recent advancements in the semiconductor manufacturing technology components of microelectronic packages are becoming smaller and circuitry within such components is becoming increasingly dense. As the circuit density increases, heat generation from such components also increases.

Various techniques are employed to dissipate the heat generated from microelectronic packages. For example, a heat dissipating device such as an integrated heat spreader (IHS) may be employed to dissipate the generated heat to the surrounding environment. Typically, a thermally conductive material such as a thermal interface material (TIM) is employed to thermally couple the heat dissipating device to a semiconductor die. One challenge is thermal degradation of the thermal interface material due to delamination of the thermal interface material from the heat dissipating device. Further, stresses may be caused in the microelectronic package due to coefficient of thermal expansion (CTE) mismatch between the components of the package.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 3 is a table with exemplary alloys for use as solder thermal interface material in the microelectronic package of FIG. 1 in accordance with embodiments of present technique.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

As discussed in detail below, the embodiments of the present invention function to provide a microelectronic package with high temperature thermal interface materials. In particular, the present technique provides a structure to enable solder thermal interface materials for ball grid array (BGA) packages.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The following description includes terms, such as top, bottom etc. that are used for descriptive purposes only and are not to be construed as limiting. The embodiments of the device or article described herein can be manufactured or used in a number of positions and orientations.

Figure 1:
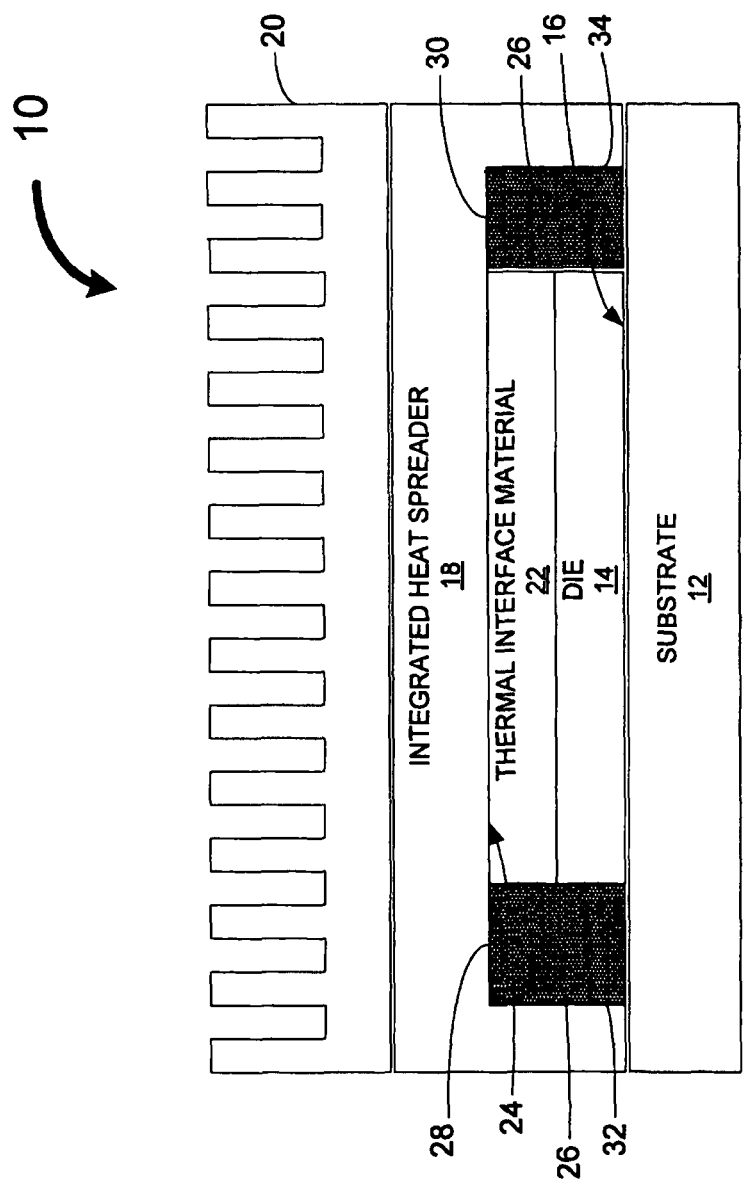
FIG. 1 illustrates a microelectronic package in accordance with embodiments of present technique.

Referring first to FIG. 1, a microelectronic package 10 is illustrated. The microelectronic package 10 includes a substrate 12 and a die 14 coupled to a top surface 16 of the substrate 12. The substrate 12 may be formed of a variety of materials including ceramic and printed circuit boards. Further, the substrate 12 may be a one-layer board or a multi-layer board. In certain embodiments, the die 14 forms one of a data storage device, a digital signal processor, a microcontroller and a hand-held device. Typically, the die 14 is attached to the substrate 12 and the attachment may be through a plurality of solder balls or solder bump connections (not shown), among other attachment methods.

The microelectronic package 10 includes a heat dissipating device such as a integrated heat spreader 18 and a heat sink 20 (e.g., a multi-fin heat sink) for dissipating the heat generated from the microelectronic package 10 to the surrounding environment. The integrated heat spreader 18 may be formed of a suitable conductive material such as copper, aluminum and carbon composites, among others. In the microelectronic package 10, the integrated heat spreader 18 is in thermal contact with the die 14 through a thermal interface material (TIM) 22. As illustrated, the thermal interface material 22 is disposed between the die 14 and the integrated heat spreader 18 adjacent to a bottom side 24 of the integrated heat spreader 18. Examples of the thermal interface material 22 include, but are not limited to, a polymer, a solder and a polymer solder hybrid (PSH).

In operation, heat is typically conducted from the die 14 through the thermal interface material 22 to the integrated heat spreader 18 by heat conduction. Further, the heat is transferred from the integrated heat spreader 18 to the heat sink 20 and the convective heat transfer primarily transfers the heat from the heat sink 20 to the surrounding environment.

In the illustrated embodiment, the microelectronic package 10 includes an underfill material 26 disposed between the integrated heat spreader 18 and the substrate 12. As illustrated, the underfill material 26 is disposed within gaps 28 and 30 between integrated heat spreader walls 32, 34, the die 14 and the thermal interface material 22. In one embodiment, the underfill material 26 includes a non-conductive polymer having a modulus of between about 8 Giga Pascals (GPa) to about 12 GPa. In one embodiment, the polymer 26 includes epoxy. In another embodiment, the polymer 26 includes urethane. In certain other embodiments, the polymer 26 includes a thermo-plastic elastomer. The underfill material 26 absorbs stress from the coefficient of thermal expansion (CTE) mismatch between components of the microelectronic package 10. In one embodiment, the integrated heat spreader 18 includes at least one hole (not shown) to dispose the underfill material 26 within the gaps 28 and 30.

It is noted and defined herein that the integrated heat spreader 18 is a structure formed from a single, suitable conductive material, as discussed above, such as by molding, milling, or stamping a single piece of suitable conductive material, as well known in the art. Thus, the portion of the heat spreader 18 forming the integrated heat spreader bottom surface 24 and the portion(s) of the integrated heat spreader 18 forming the integrated heat spreader side walls 32, 34 are the same single, suitable conductive material, as illustrated in FIG. 1.

In one embodiment, the thermal interface material 22 comprises a solder thermal interface material having a reflow temperature of greater than about 210° C. In this embodiment, the solder thermal interface material 22 is surrounded by the underfill material 26 so that during a solder reflow precondition at a temperature of about 260° C., the solder thermal interface material 22 remains between the die 14 and the integrated heat spreader 18. In one embodiment, the solder thermal interface material 22 and the underfill material 26 may be cured together during assembly of the microelectronic package 10.

In one embodiment, the microelectronic package 10 includes a plurality of solder balls (not shown) to attach the microelectronic package 10 to a printed circuit assembly (not shown) through a ball grid array (BGA) surface mount packaging. In one embodiment, the solder thermal interface material 22 is selected such that the material can be reflowed along with ball grid array lead free solder balls at a temperature of greater than about 245° C. In certain embodiments, a reflow time of combined solder thermal interface material 22 and the ball grid array lead free solder balls is between about 5 minutes to about 12 minutes.

The solder thermal interface material 22 may include alloys of indium (In), tin (Sn), copper (Cu), silver (Ag), gold (Au), nickel (Ni), antimony (Sb) and bismuth (Bi), among others. In one embodiment, the solder thermal interface material 22 includes substantially pure In. In one embodiment, the solder thermal interface material 22 includes In-based alloys. In one embodiment, the solder thermal interface material 22 includes pure Sn. In one embodiment, the solder thermal interface material 22 includes Sn/xAu (x=80.0 wt. %). In one embodiment, the solder thermal interface material 22 includes Sn/xCu (x=1.2-1.75 wt. %). In one embodiment, the solder thermal interface material 22 includes Sn/xAg (x=5.0-7.0 wt. %).

In one embodiment, the solder thermal interface material 22 includes Sn/xAg/yCu (x=5.0-7.0 wt. % and y=1.2-1.75 wt. %). In one embodiment, the solder thermal interface material 22 includes Sn/xNi (x=0.5 to 1.0 wt. %). In one embodiment, the solder thermal interface material 22 includes Sn/xSb (x=2.0 to 9.4 wt. %). In one embodiment, the solder thermal interface material 22 includes Sn/xCu (x=up to 1.2 wt. %). In one embodiment, the solder thermal interface material 22 includes Sn/xAg (x=up to 5.0 wt. %). In one embodiment, the solder thermal interface material 22 includes Sn/xNi (x=up to 0.5 wt. %). In one embodiment, the solder thermal interface material 22 includes Sn/xIn (x=1.0 to 10.0 wt. %). In one embodiment, the solder thermal interface material 22 includes Sn/xBi (x=up to 12.0 wt. %). In one embodiment, the solder thermal interface material 22 includes Sn/xAg/yCu/z (In or Bi or both) (x=up to 4.5 wt. %, y=0.0 to 1.0 wt. % and z=<5.0 wt %). In certain embodiments, the solder thermal interface material 22 may include different combinations of the compositions described above. However, several other compositions may be envisaged.

In one embodiment, a thickness of the thermal interface material 22 is between about 1 mil to about 3 mils. Further, a thickness of the underfill material 26 is between about 5 mils to about 15 mils. It should be noted that by using the underfill material 26 the thickness of the thermal interface material 22 is reduced in the microelectronic package 10 thereby reducing the cost of manufacturing the microelectronic package 10. In one embodiment, the cost of manufacturing the microelectronic package 10 is between about 50% to about 75% lesser than the cost of manufacturing a microelectronic package without the underfill material 26.

Figure 2:
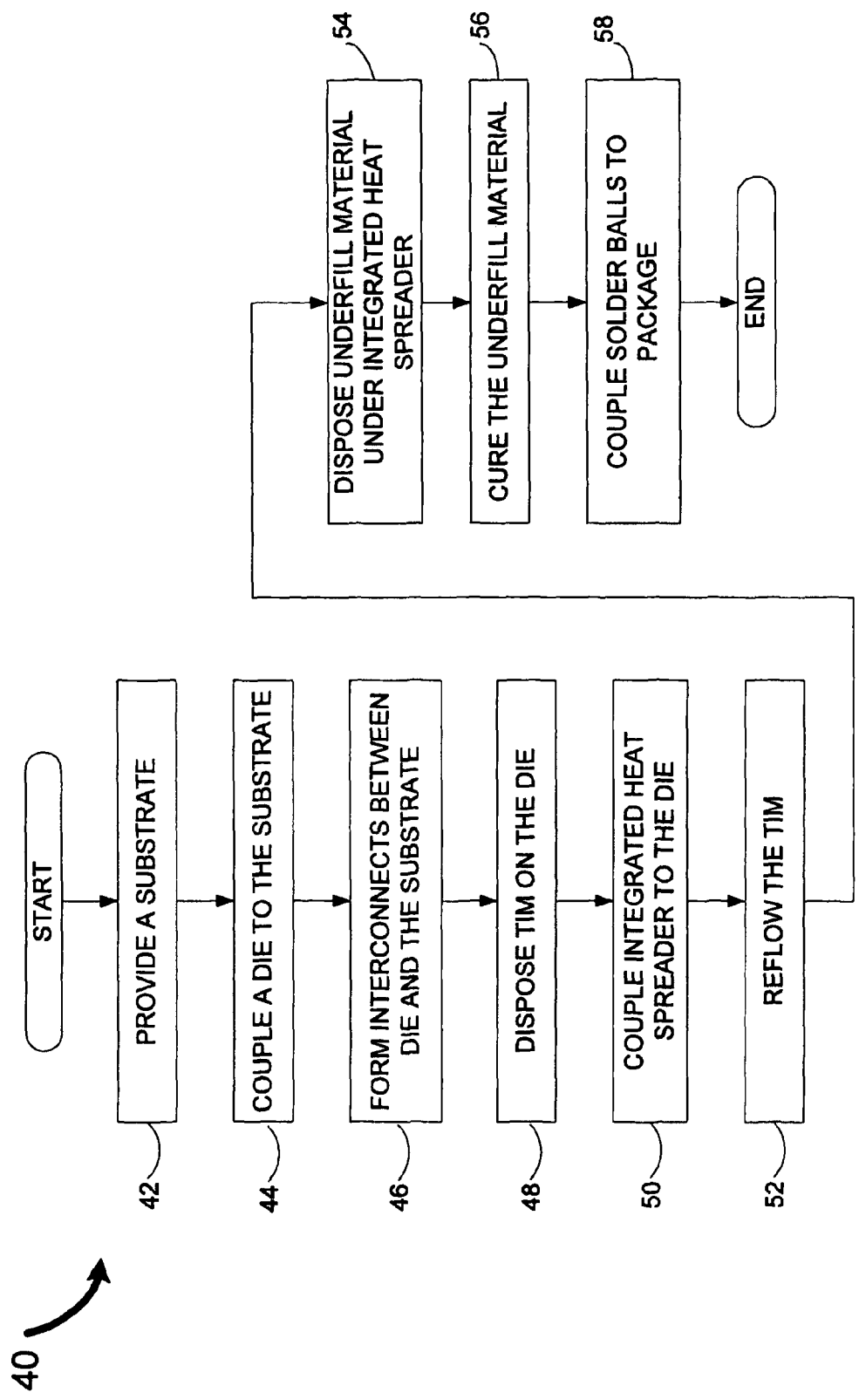
FIG. 2 illustrates an exemplary process for forming the microelectronic package of FIG. 1 in accordance with embodiments of present technique.

FIG. 2 illustrates an exemplary process 40 for forming the microelectronic package 10 of FIG. 1. At block 42, a substrate is provided. The substrate may be formed of a variety of materials including ceramic and printed circuit boards. Further, at block 44, a die is coupled to a top surface of the substrate. At block 46, interconnects are formed between the die and the substrate. In one embodiment, the die is attached to the substrate through a plurality of solder balls. In another embodiment, the die is attached to the substrate through solder bump connections. However, a variety of other attachment arrangements may be used.

At block 48, a thermal interface material is disposed on the die. In one embodiment, the thermal interface material includes a solder thermal interface material. In another embodiment, the thermal interface material includes a polymer thermal interface material. In certain embodiments, the thermal interface material includes a polymer solder hybrid material. In one embodiment, the thermal interface material includes a solder thermal interface material having a reflow temperature of greater than about 210° C. Such solder interface material may be reflowed along with ball grid array lead free solder balls for a ball grid array (BGA) surface mount microelectronic package.

At block 50, an integrated heat spreader is coupled to the die. The integrated heat spreader includes integrated heat spreader walls. Further, at block 52, the thermal interface material is reflowed to form the contact between the die and the integrated heat spreader. Further, an underfill material is disposed under the integrated heat spreader, as represented by block 54. In this embodiment, the underfill material fills gaps between the integrated heat spreader walls, the die and the thermal interface material. In one embodiment, the underfill material includes a non-conductive polymer having a modulus of between about 8 Giga Pascals (GPa) to about 12 GPa. In one embodiment, the polymer includes epoxy. In another embodiment, the polymer includes urethane. In certain other embodiments, the polymer includes a thermo-plastic elastomer. In one embodiment, the underfill material is disposed under the integrated heat spreader using a capillary underfill process.

At block 56, the underfill material is cured. In one embodiment, a curing time of the underfill material is about 25 minutes. Further, a peak temperature during the curing process is about 145° C. Further, at block 58, a plurality of solder balls are attached to the microelectronic package. The solder balls attach the microelectronic package to a printed circuit assembly through a ball grid array (BGA) surface mount packaging. As described before, in certain embodiments, the solder thermal interface material may be reflowed along with the solder balls at a temperature of about 245° C.

As described above, a nonconductive polymer material 26 (see FIG. 1) may be disposed below the integrated heat spreader 18 (see FIG. 1) to absorb stress due to coefficient of thermal expansion (CTE) mismatch of components of the microelectronic package 10 (see FIG. 1) thereby enabling use of a relatively thin thermal interface material (see FIG. 1). In one embodiment, the thickness of the solder thermal interface material 22 is between about 1 mil to about 3 mils and the thickness of polymer material 26 is between about 5 mils to about 15 mils.

A variety of solder thermal interface materials 22 may be used with the non-conductive polymer 26 in the microelectronic package 10. In one embodiment, the solder thermal interface material 22 has a thermal conductivity of between about 40 W/Km to about 80 W/Km. In one embodiment, the melting point of the thermal interface material 22 is such that the material remains in a solid state during surface mount reflow of the microelectronic package 10.

In certain embodiments, the solder thermal interface material 22 has a melting point of greater than about 245° C. Such material remains solid during the surface mount reflow and do not squeeze out during the reflow process. In one exemplary embodiment, the solder thermal interface material 22 includes Sn/xAu (x=80.0 wt. %) having a melting point of about 280° C. In one exemplary embodiment, the solder thermal interface material 22 includes Sn/xCu (x=1.2-1.75 wt. %) having a melting point of between 245° C. to about 280° C. In one exemplary embodiment, the solder thermal interface material 22 includes Sn/xAg (x=5.0-7.0 wt. %) having a melting point of between 245° C. to about 280° C. In one exemplary embodiment, the solder thermal interface material 22 includes Sn/xAg/yCu (x=5.0-7.0 wt. % and y=1.2-1.75 wt. %) having a melting point of between 245° C. to about 280° C. In one exemplary embodiment, the solder thermal interface material includes Sn/xNi (x=0.5 to 1.0 wt. %) having a melting point of between 245° C. to about 280° C. In one exemplary embodiment, the solder thermal interface material 22 includes Sn/xSb (x=2.0 to 9.4 wt. %) having a melting point of between 245° C. to about 280° C.

In certain other embodiments, the solder thermal interface material 22 has a melting point of less than about 245° C. In one embodiment, the solder thermal interface material has a melting point of about greater than 217° C. Since the viscosity of molten metal exponentially reduces with increase in temperature above the melting point of the material, these materials have substantially high resistance to squeeze-out of these materials.

In one exemplary embodiment, the solder thermal interface material 22 includes pure Sn having a melting point of about 232° C. In one exemplary embodiment, the solder thermal interface material 22 includes Sn/xCu (x=up to 1.2 wt. %) having a melting point of between 227° C. to about 245° C. In one exemplary embodiment, the solder thermal interface material 22 includes Sn/xAg (x=up to 5.0 wt. %) having a melting point of between 217° C. to about 245° C. In one exemplary embodiment, the solder thermal interface material 22 includes Sn/xNi (x=up to 0.5 wt. %) having a melting point of between 231° C. to about 245° C. In one exemplary embodiment, the solder thermal interface material 22 includes Sn/xIn (x=1.0 to 10.0 wt. %) having a melting point of between 220° C. to about 232° C. In one exemplary embodiment, the solder thermal interface material 22 includes Sn/xBi (x=up to 12.0 wt. %) having a melting point of between 220° C. to about 232° C. In one exemplary embodiment, the solder thermal interface material 22 includes Sn/xAg/yCu/z(In or Bi or both) (x=up to 4.5 wt. %, y=0.0 to 1.0 wt. % and z=<5.0 wt %) having a melting point of between 217° C. to about 245° C.

In one embodiment, Sn—X alloys may be designed based on the following empirical relationship:

$$LT(K) = 499.79 - 7.799M \quad (1)$$

Where: LT is liquidus temperature; and
M is total amount of alloying element in mol %.

Based on the above relationship, a variety of compositions may be designed for the solder thermal interface material 22 to meet a specific reflow temperature target. For example, for a reflow temperature target of about 210° C., a total amount of alloying elements (in mol %) of about 9.33% is required according to the above relationship.

Exemplary alloys designed by the above equation (1) are listed in table 70 of FIG. 3. As illustrated, a plurality of alloying elements 72 may be used to form the composition. In this embodiment, the alloying elements 72 include copper, silver, bismuth, zinc, indium, titanium and tungsten. The total amount of the alloying elements is 9.33% as represented by reference numeral 74. As illustrated, different eutectic percentages 76 of the alloying elements 72 may be combined to form different compositions 78 of alloys to achieve the reflow temperature target of about 210° C. It should be noted that the exemplary alloys 78 described above have relatively less amount of indium thereby reducing cost of use of such materials as the thermal interface material 22.

Figure 4:
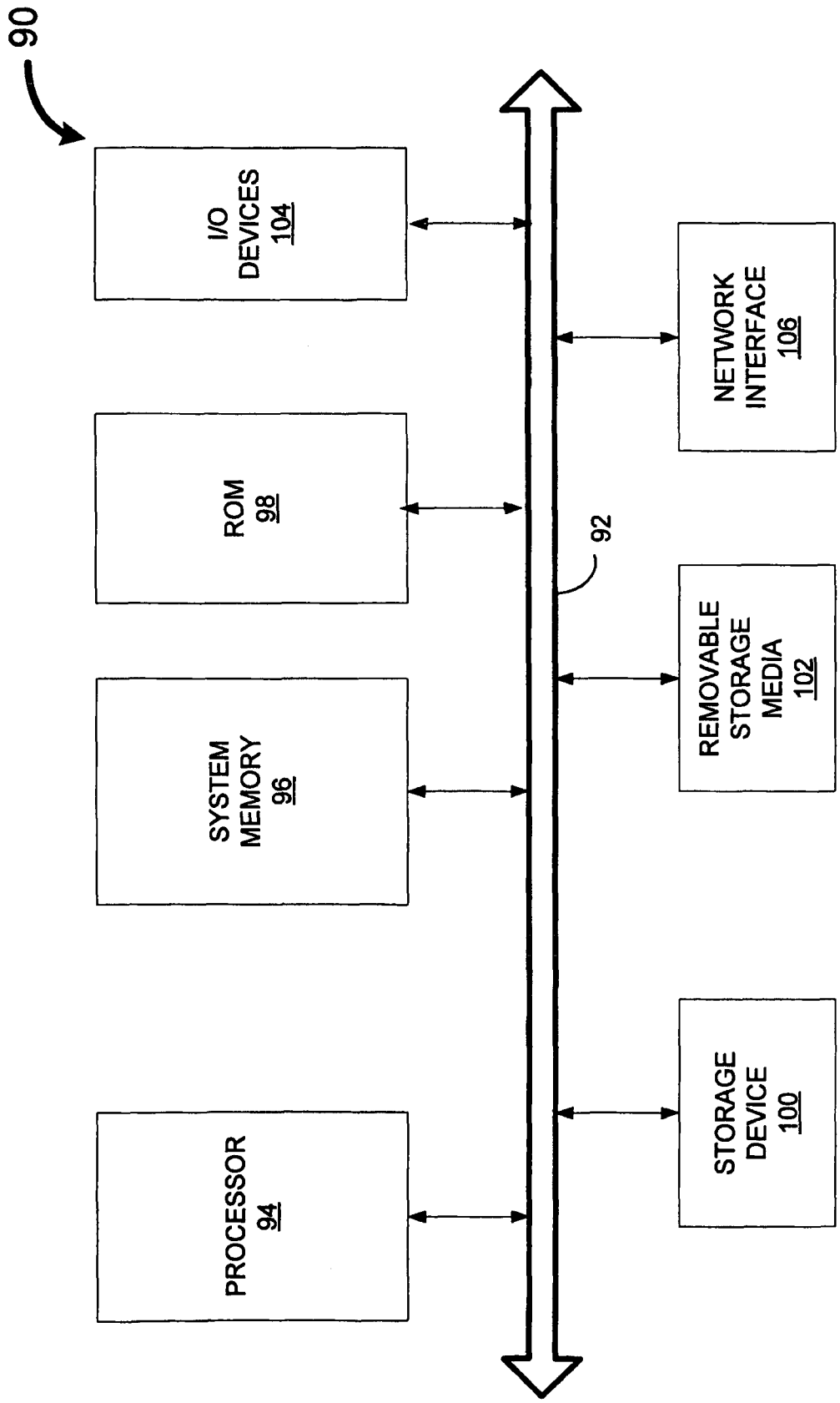
FIG. 4 illustrates an embodiment of a computer system.

The microelectronic package 10 described above may be disposed in a computer system, a wireless communicator and a hand-held device. FIG. 4 illustrates an embodiment of a computer system 90. The computer system 90 includes a bus 92 to which the various components are coupled. In certain embodiments, the bus 92 includes a collection of a plurality of buses such as a system bus, a Peripheral Component Interface (PCI) bus, a Small Computer System Interface (SCSI) bus, etc. Representation of these buses as a single bus 92 is provided for ease of illustration, and it should be understood that the system 90 is not so limited. Those of ordinary skill in the art will appreciate that the computer system 90 may have any suitable bus architecture and may include any number of combination of buses.

A processor 94 is coupled to the bus 92. The processor 94 may include any suitable processing device or system, including a microprocessor (e.g., a single core or a multi-core processor), a network processor, an application specific integrated circuit (ASIC), or a field programmable gate array (FPGA), or any similar device. It should be noted that although FIG. 4 shows a single processor 94, the computer system 90 may include two or more processors.

The computer system 90 further includes system memory 96 coupled to the bus 92. The system memory 96 may include any suitable type and number of memories, such as static random access memory (SRAM), dynamic random access memory (DRAM), synchronous dynamic random access memory (SDRAM), or double data rate DRAM (DDRDRAM). During operation of the computer system 90, an operating system and other applications may be resident in the system memory 96.

The computer system 90 may further include a read-only memory (ROM) 98 coupled to the bus 92. The ROM 98 may store instructions for the processor 94. The computer system 90 may also include a storage device (or devices) 100 coupled to the bus 92. The storage device 100 includes any suitable non-volatile memory, such as, for example, a hard disk drive. The operating system and other programs may be stored in the storage device 100. Further, a device 102 for accessing removable storage media (e.g., a floppy disk drive or a CD ROM drive) may be coupled to the bus 92.

The computer system 90 may also include one or more Input/Output (I/O) devices 104 coupled to the bus 92. Common input devices include keyboards, pointing devices such as a mouse, as well as other data entry devices. Further, common output devices include video displays, printing devices, and audio output devices. It will be appreciated that these are but a few examples of the types of I/O devices that may be coupled to the computer system 90.

The computer system 90 may further comprise a network interface 106 coupled to the bus 92. The network interface 106 comprises any suitable hardware, software, or combination of hardware and software that is capable of coupling the system 90 with a network (e.g., a network interface card). The network interface 106 may establish a link with the network over any suitable medium (e.g., wireless, copper wire, fiber optic, or a combination thereof) supporting exchange of information via any suitable protocol such as TCP/IP (Transmission Control protocol/Internet Protocol), HTTP (HyperText Transmission Protocol, as well as others.

It should be understood that the computer system 90 illustrated in FIG. 4 is intended to represent an embodiment of such a system and, further, that this system may include any additional components, which have been omitted for clarity and ease of understanding. By way of example, the system 90 may include a direct memory access (DMA) controller, a chip set associated with the processor 94, additional memory (e.g., cache memory) as well as additional signal lines and buses. Also, it should be understood that the computer system 90 may not include all the components shown in FIG. 4. The computer system 90 may comprise any type of computing device, such as a desktop computer, a laptop computer, a server, a hand-held computing device, a wireless communication device, an entertainment system etc.

In this embodiment, the computer system 90 may include the microelectronic package as described in the embodiments above. By way of example, the processor 134 may include a substrate and a die. An integrated heat spreader may be thermally coupled to the die and a thermal interface material may be disposed between the die and the integrated heat spreader. Further, an underfill material as described in the embodiments above may be disposed between the integrated heat spreader and the substrate, wherein the underfill material is disposed within gaps between the integrated heat spreader walls, the die and the thermal interface material.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

The invention claimed is:

1. A microelectronic package, comprising:
a substrate;
a die coupled to a top surface of the substrate;
an integrated heat spreader thermally coupled to the die, wherein the integrated heat spreader comprises integrated heat spreader walls;
a thermal interface material disposed between the die and the integrated heat spreader, wherein the thermal interface temperature comprises a solder thermal interface material having a reflow temperature of greater than about 210° C.;
an elastomer underfill material disposed between the integrated heat spreader and the substrate, wherein the underfill material is disposed within gaps between the integrated heat spreader walls, the die and the thermal interface material; and
a plurality of solder balls coupled to the substrate, wherein the plurality of solder balls are to attach the microelectronic package to a printed circuit assembly, wherein a reflow temperature of the thermal interface material and the plurality of solder balls is about 245° C. and a reflow time is between about 5 minutes to about 12 minutes.

2. A microelectronic package, comprising:
a substrate;
a die coupled to a top surface of the substrate;
a integrated heat spreader thermally coupled to the die, wherein the integrated heat spreader comprises integrated heat spreader walls; wherein the integrated heat spreader walls extend adjacent to the substrate;
a thermal interface material disposed between the die and the integrated heat spreader;
an elastomer underfill material disposed between the integrated heat spreader and the substrate, wherein the underfill material is disposed within gaps between the integrated heat spreader walls, the die and the thermal interface material; and
a plurality of solder balls coupled to the substrate, wherein the plurality of solder balls are to attach the microelectronic package to a printed circuit assembly, wherein the underfill material is to absorb stress from coefficient of thermal expansion (CTE) mismatch between components of the microelectronic package.

* * * * *